United States Patent
Dressler et al.

(10) Patent No.: US 7,833,822 B2
(45) Date of Patent: Nov. 16, 2010

(54) METHOD FOR MAKING PMC TYPE MEMORY CELLS

(75) Inventors: Cyril Dressler, Tullins (FR); Véronique Sousa, Grenoble (FR)

(73) Assignee: Commissariat A l'Energie Atomique, Paris (FR)

( * ) Notice: Subject to any disclaimer, the term of this patent is extended or adjusted under 35 U.S.C. 154(b) by 891 days.

(21) Appl. No.: 11/614,358

(22) Filed: Dec. 21, 2006

(65) Prior Publication Data
US 2007/0148882 A1 Jun. 28, 2007

(30) Foreign Application Priority Data
Dec. 23, 2005 (FR) ................... 05 13258

(51) Int. Cl.
*H01L 21/00* (2006.01)
(52) U.S. Cl. ................... 438/95; 257/E45.002; 365/182
(58) Field of Classification Search ................ 257/3–4, 257/508, 489, 750, 751, 762, 225, 246, 314, 257/200, E31.029, E45.002, E27.004; 365/94; 438/95, 514
See application file for complete search history.

(56) References Cited

U.S. PATENT DOCUMENTS

| | | | |
|---|---|---|---|
| 5,761,115 A | 6/1998 | Kozicki et al. | |
| 6,114,713 A * | 9/2000 | Zahorik | 257/4 |
| 6,864,521 B2 | 3/2005 | Moore et al. | |
| 6,864,522 B2 | 3/2005 | Krieger et al. | |
| 6,878,569 B2 | 4/2005 | Li | |
| 2003/0045049 A1 | 3/2003 | Campbell et al. | |
| 2003/0045054 A1 * | 3/2003 | Campbell et al. | 438/257 |
| 2003/0068861 A1 * | 4/2003 | Li et al. | 438/257 |
| 2004/0192006 A1 | 9/2004 | Campbell et al. | |
| 2005/0162907 A1 | 7/2005 | Campbell | |

FOREIGN PATENT DOCUMENTS

WO WO 2006/034946 A1 4/2006

OTHER PUBLICATIONS

U.S. Appl. No. 11/722,761, filed Jun. 25, 2007, Sousa.

* cited by examiner

*Primary Examiner*—Davienne Monbleau
*Assistant Examiner*—Shweta Mulcare
(74) *Attorney, Agent, or Firm*—Oblon, Spivak, McClelland, Maier & Neustadt, L.L.P.

(57) ABSTRACT

A microelectronic device includes: at least one cell or element including at least one first electrode, at least one second electrode, and at least one stack of thin layers between the first electrode and the second electrode. The stack includes at least one doped chalcogenide layer capable of forming a solid electrolyte, the doped chalcogenide layer being provided on and in contact with the first electrode; at least one interface layer provided on and in contact with the doped chalcogenide layer, the interface layer being based on a material different from the chalcogenide, the material being carbon or carbon comprising a metallic additive or a semiconducting additive; and at least one metallic ion donor layer provided on and in contact with the interface layer, the metallic ion donor layer being an ion source for the solid electrolyte.

8 Claims, 6 Drawing Sheets

METHOD FOR MAKING PMC TYPE MEMORY CELLS

TECHNICAL FIELD

This invention relates to the domain of microelectronics and more particularly to microelectronic devices such as memories provided with one or several PMC (Programmable Metallization Cell) type elements or cells, said cells comprising at least two electrodes and a stack of thin layers between the electrodes, said stack comprising at least one layer that will form a solid electrolyte that may be based on at least one chalcogenide, for example doped by metallic particles.

In particular, the invention relates to an improved microelectronic method for manufacturing PMC type elements, including the production of means to prevent the formation of metallic agglomerates on the solid electrolyte. The method according to the invention can also be used to obtain a photodiffusion step to dope the chalcogenide layer. The invention also relates to a microelectronic device provided with improved PMC cells.

PRIOR ART

Operation of PMC type devices is based on the formation of metallic elements called "dendrites" between two electrodes within a solid electrolyte, when these electrodes are set to appropriate corresponding potentials. The formation of dendrites can result in a given electrical conduction between the two electrodes. By modifying the corresponding potentials applied to electrodes, it is possible to modify the distribution and number of dendrites and thus modify the electrical conduction between the two electrodes. For example, by inverting the potential between the electrodes, it is possible to make the dendrites disappear or to reduce them, so as to delete or considerably reduce electrical conduction due to the presence of dendrites. PMC cells can thus have a two-state operation: a so-called "ON" state and a so-called "OFF" state, and for example can act as memory cells.

Document U.S. Pat. No. 5,761,115 presents several variants of a microelectronic device according to prior art provided with at least one PMC type cell, and a method for making this device. FIGS. 1A to 1C show such a method. The first step is deposition of a first layer 11 that will act as an ionic conductor or solid electrolyte onto a substrate 10, for example based on silicon or glass or plastic. This first layer 11 may be based on at least one chalcogenide, for example GeSe, and for example made by vacuum evaporation (FIG. 1A). A second so-called "doping" layer 12 is then formed on the first layer 11. The second layer 12 may be metallic, for example based on silver and made using vacuum deposition by evaporation. A step for photodissolution of the metal in the second layer 12 in the first layer 11 is then done using UV rays 20 (FIG. 1B). At the end of this photodissolution, a layer of ionic conducting material 13, for example based on a chalcogenide doped by particles, in other words silver atoms or groups of silver atoms, is formed (FIG. 1C). With such a method, the metal agglomerates, for example composed of silver, tend to form on the surface of the chalcogenide based layer. Such agglomerates 50 are harmful to operation of the cell and are shown for example in FIG. 5A.

One solution to the problem of formation of metal agglomerates on the surface of the chalcogenide based layer is proposed in document U.S. Pat. No. 6,878,569 B2. This document also discloses a microelectronic method for making a microelectronic device provided with at least one PMC type element. In this method, the first step is to form a first metallic electrode 201 on the substrate 200, for example by deposition (FIG. 2A). A chalcogenide based layer 202, for example GeSe, is then formed on this first electrode 201 (FIG. 2B). The next step is to deposit a layer on the chalcogenide based layer 202 so as to dope the chalcogenide, such as a layer 203 based on at least one metallic material, for example silver (FIG. 2C). A barrier layer 204 with a composition identical to the composition of the chalcogenide layer 202 is then deposited on the layer 203 of metallic material (FIG. 2D). A photodissolution of said metallic material is then done using UV rays 220 (FIG. 2E). Photodissolution leads to the formation of an ionic conducting layer 206 based on chalcogenide doped by metallic particles. A second electrode 205, for example made of silver, is then formed on the barrier layer 204 (FIG. 2F).

During such a method, the previously described photodissolution step is usually done using a layer of metallic doping layer, for example a very thin silver layer limited so as to enable the passage of UV rays. This limited thickness results in a small applications field on the PMC cell thus made. In some cases, photodissolution also causes problems with the precision of doping of the chalcogenide layer. Photodissolution also requires the use of special equipment and adds another step to the method for making the PMC cell.

Document U.S. Pat. No. 6,864,521 B2 discloses a variant embodiment for a PMC type cell comprising steps to form a first electrode 301 on a substrate 300, and then to form a first chalcogenide based layer 302, for example GeSe, on the first electrode 301, and then to make a first so-called "doping" layer 303 based on chalcogenide and a material, for example metallic material, to dope the first chalcogenide layer 302. The doping layer 303 may be based on AgSe. A second chalcogenide based layer 304, for example based on GeSe, is then made on the doping layer 303 and a second doping layer 305 based on a metallic material, for example silver, is then formed on the second chalcogenide based layer 304. A second electrode 306 is then formed on the second doping layer 305 (FIG. 3). Such a method has the disadvantage of using a large number of steps to form the solid electrolyte.

The problem that arises is to find a new method for making a microelectronic device with PMC type cells that does not have the disadvantages mentioned above.

PRESENTATION OF THE INVENTION

The invention relates firstly to a method for making a microelectronic device provided with one or several cells or elements comprising at least one first electrode, at least one second electrode, and at least one thin layer that can form a solid electrolyte between the first electrode and the second electrode, the method comprising steps to:

a) make at least one doped chalcogenide layer on at least one first conducting layer that will form said solid electrolyte, b) form at least one layer called the "interface" layer based on a given material different from said chalcogenide, on the doped chalcogenide layer, c) form at least one metallic layer called the "ion donor" layer on the interface layer, that will form an ion source for said solid electrolyte.

The given material can be carbon or carbon with a metallic additive such as silver, or a semi conducting additive such as Si.

Such a material can form a thin interface layer with good continuity and a uniform thickness, while providing the PMC cell with good electrical properties.

The composition and thickness of the interface layer are compatible with diffusion of metallic ions output from an ion donor layer in the doped chalcogenide layer.

Production of the interface layer particularly avoids the formation of agglomerates on the surface of the solid electrolyte.

Said interface layer may be between 1 and 10 nanometers thick, and preferably between 1 and 5 nanometers thick.

According to one possibility, the formation of said doped chalcogenide layer may comprise:

deposition of at least one layer based on at least one chalcogenide, deposition by cathode sputtering of a thin metallic layer on said chalcogenide layer.

Deposition of said thin metallic layer on said chalcogenide layer by cathode sputtering enables a homogenous distribution of the doping metallic species in the chalcogenide without needing a photodissolution step, and for example using standard equipment in the microelectronics industry.

According to one possibility that can be combined with the previous possibility, said interface layer that may be formed by cathode sputtering. Said interface layer may possibly be formed by cathode sputtering in the same reactor or a same deposition chamber as the doped chalcogenide layer.

According to another possibility that may be combined with the previous possibilities, said metallic "ion donor" layer may be formed by cathode sputtering. Said metallic "ion donor" layer may possibly be formed by cathode sputtering in the same reactor or in the same chamber as the doped chalcogenide layer and/or the interface layer.

The method may also comprise formation of the second electrode based on a metallic material different from that making up said metallic ion donor layer, on and in contact with the metallic ion donor layer.

According to one variant, the metallic ion donor layer may be made sufficiently thick to act as a second electrode.

The invention also relates to a microelectronic device provided with one or several cells or elements comprising at least one first electrode, at least one second electrode, and at least one stack of thin layers between the first electrode and the second electrode, said stack comprising:

at least one doped chalcogenide layer capable of forming a solid electrolyte on and in contact with the first electrode, at least one so-called "interface" layer on and in contact with said doped chalcogenide layer and based on a given material different from said chalcogenide, at least one so-called metallic "ion donor" layer on and in contact with said "interface" layer and that will form an ion source for said solid electrolyte.

The given material can be carbon or carbon with a metallic additive or a semi conducting additive.

The invention also relates to a memory device comprising a microelectronic device like that described above.

The interface layer may be sufficient to form PMC type memory cells provided with better cyclability, or robustness with regard to a large number of state changes or write/erase operations, than memory cells according to prior art.

Said interface layer may be between 1 and 10 nanometers thick.

According to one possible embodiment of the device, said metallic "ion donor" layer may belong to said second electrode.

According to one variant, said second electrode is supported on said metallic "ion donor" layer.

BRIEF DESCRIPTION OF THE DRAWINGS

This invention will be better understood after reading the description of example embodiments given purely for guidance and in no way limitative, with reference to the appended figures, wherein.

Identical, similar or equivalent parts of the different figures are marked with the same numbers so as to facilitate cross references from one figure to another.

The different parts shown in the figures are not necessarily all at the same scale, to make the figures more easily readable.

DETAILED PRESENTATION OF PARTICULAR EMBODIMENTS

An example of a microelectronic method according to the invention will now be given with reference to FIGS. 4A to 4E. The purpose of this method is to make a microelectronic device, for example a memory, provided with at least one PMC type cell or element, the cell or element being formed from a stack of thin layers between at least one first electrode and at least one second electrode, comprising at least one layer based on at least one chalcogenide, doped for example with metallic particles, capable of forming a solid electrolyte or an ion conductor.

The initial material in the method may be a support, for example comprising a layer of insulating material 401, for example SiO$_2$ supported on a substrate 400 that may be semi conducting, for example based on silicon. A first conducting layer 402 that will form a first electrode or "lower electrode", for example based on nickel or tungsten, is then made on the layer 401 of said support. The formation of the first electrode may be completed for example by a photolithography step, then an etching step of the first conducting layer 402.

Figure 1A:
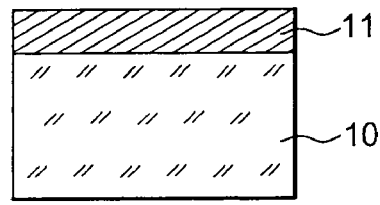
FIGS. 1A-1C, 2A-2F, and 3 described above illustrate methods for making PMC cells according to prior art.
Figure 1B:
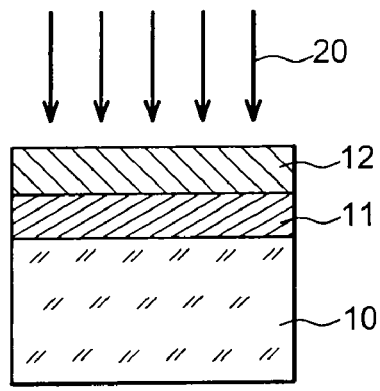
Figure 1C:
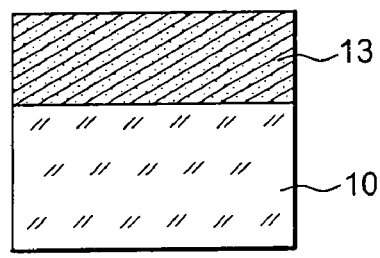
Figure 2A:
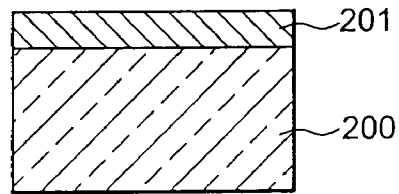
Figure 2B:
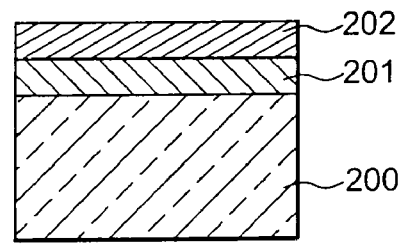
Figure 2C:
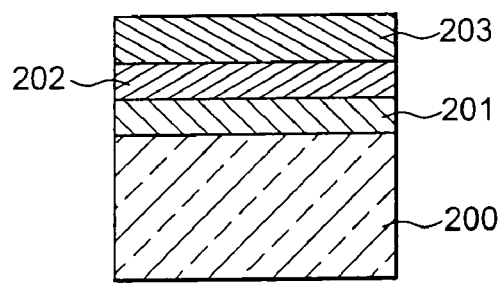
Figure 2D:
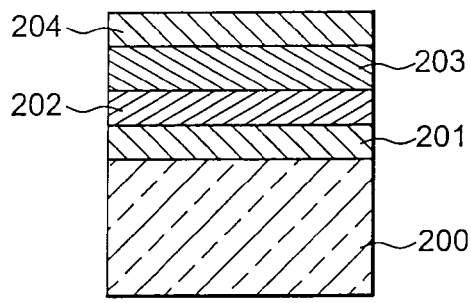
Figure 2E:
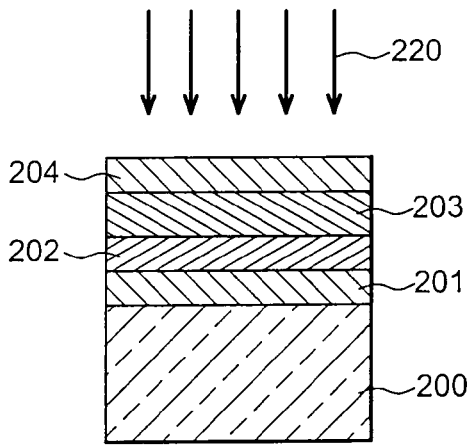
Figure 2F:
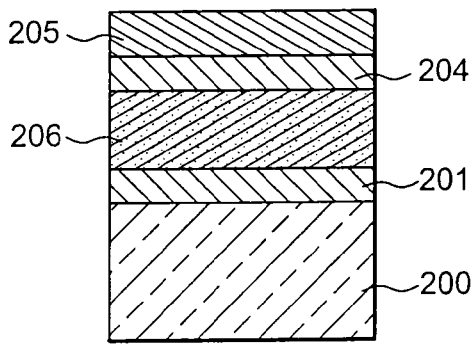
Figure 3:
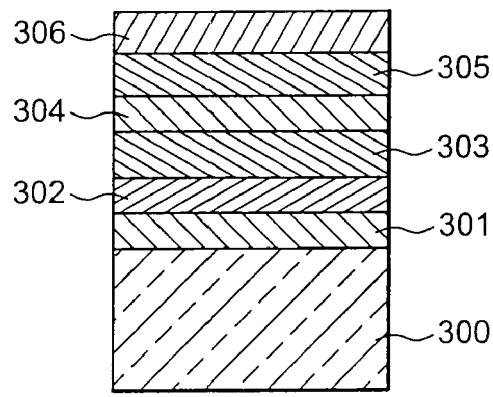
Figure 4A:
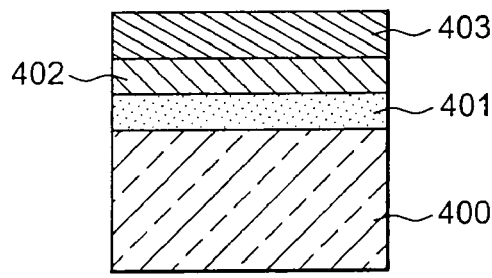
FIGS. 4A-4E illustrate different steps in an example method according to the invention, for making a microelectronic device provided with at least one improved PMC cell.

A layer 403 based on at least one chalcogenide is then formed on and in contact with the first conducting layer 402 (FIG. 4A). The layer 403 based on at least one chalcogenide may be made by deposition by vacuum evaporation or cathode sputtering and it may for example be between 10 and 100 nanometers thick, for example of the order of 50 nanometers thick. Said chalcogenide may for example be Ge$_x$Se$_y$, for example with a stoichiometry such that x=25 and y=75.

Figure 4B:
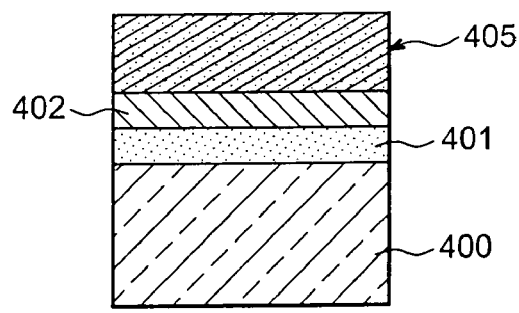

A thin doping layer (not referenced), for example a metallic layer, is then deposited on and in contact with the chalcogenide layer 403. The thin doping layer may also be made by deposition by cathode sputtering. The thin doping layer may for example be based on silver. The thin doping layer may be for example between 2 and 50 nanometers thick, or for example of the order of ⅓ of the thickness of the chalcogenide layer 403. According to one possibility, the thin doping layer may be made in the same deposition chamber as the chalcogenide layer 403. Formation of the thin doping layer 404 by cathode sputtering enables diffusion of the metallic doping agent, for example silver, directly in the chalcogenide layer 403, for example in the Ge$_x$Se$_y$ so as to form a chalcogenide based layer 405 doped by metallic particles. The doped chalcogenide based layer 405 can act as a solid electrolyte (FIG. 4B).

According to one variant, the doped chalcogenide layer 405 may be obtained by deposition of a chalcogenide based layer by vacuum evaporation, followed by deposition of a thin doping layer by vacuum evaporation, then exposure of the thin doping layer to UV rays. Advantageously, the doped chalcogenide layer 405 is made by deposition by cathode sputtering of a chalcogenide based layer and then by deposition of a thin doping layer on the chalcogenide layer by cathode sputtering.

Figure 4C:
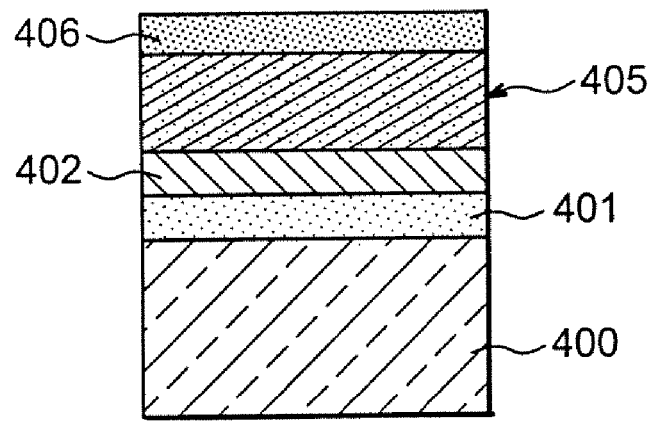
Figure 4D:
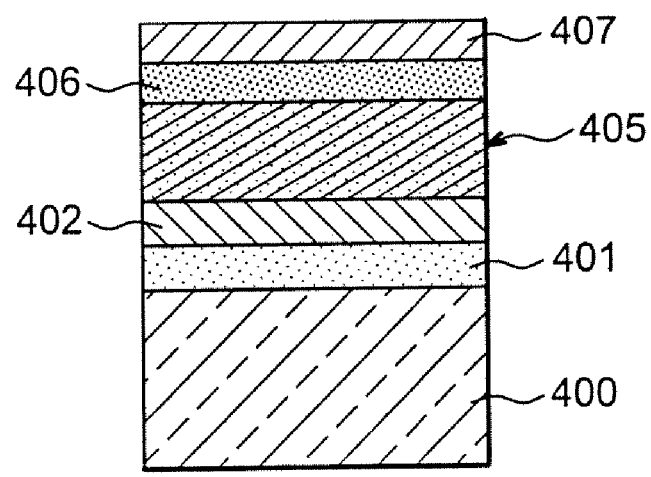

The next step is to make means for preventing the formation of metallic aggregates on the doped chalcogenide layer 405 (FIG. 4C). These means may be in the form of an interface layer 406 deposited on the doped chalcogenide layer 405.

The interface layer 406 is formed based on a given material in contact with the chalcogenide, that does not diffuse in the doped chalcogenide layer 405. The interface layer 406 is preferably formed based on a given material different from this chalcogenide. The interface layer 406 may be based on a given material different from the materials forming the doped chalcogenide layer 405.

This given material is chosen such that the very thin intermediate layer, for example between 1 and 10 nanometers thick, lowers the surface tension of the layer 405 forming a solid electrolyte and may thus prevent the formation of metallic aggregates. This given material may also be chosen such that the intermediate layer 406, even when it is very thin, for example between 1 and 10 nanometers thick, is continuous and/or has low roughness, for example less than 1 nanometer or 0.5 nanometers thick, and preferably less than 0.3 nanometers thick. The given material may for example be carbon, or carbon comprising an additive, for example a metallic additive such as copper or silver, or for example a semi conducting additive such as Si. The interface layer 406 may be formed based on a material with a resistivity of between 1 and 1000 $\Omega*cm^{-1}$, in a thin layer.

The interface layer 406 may advantageously be made in the same deposition chamber as the chalcogenide layer 403 and possibly the thin doping layer 404. The interface layer 406 may be for example between 1 and 10 nanometers thick, or between 1 and 5 nanometers thick, for example of the order of 2 nanometers thick.

The next step (FIG. 4D) is to form at least one layer 407 that can make material exchanges in the form of ions called an "ion source" or "ion donor" layer and that may be metallic and that will supply the layer 405 forming the solid electrolyte with metallic ions, on the interface layer 406. The composition of the metallic "ion donor" layer 407 is different or it may be formed from one or several materials different from the material used in the interface layer 406. The ion donor layer 407 may for example be based on silver and it is for example between 2 and 50 nanometers thick, for example of the order of 10 nanometers thick. The ion donor layer 407 may be made by cathode sputtering. According to one possible embodiment of the method, the ion donor layer 407 may be made in the same deposition chamber as the interface layer 406 and/or the doping layer 404 and/or the chalcogenide layer 403.

Figure 4E:
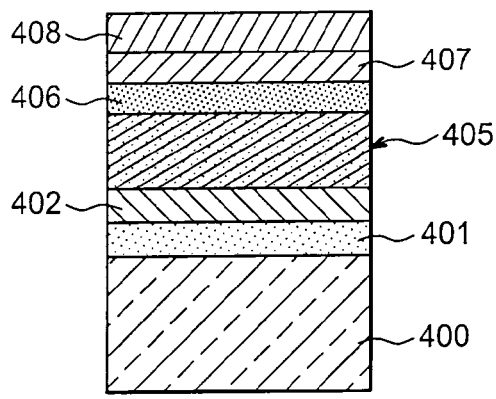

Then, a second electrode may be formed on the metallic ion donor layer 407. Formation of the second electrode may include a deposition step of a second conducting layer 408, for example based on a metal different from the metal in the layer 407, such as Ni or Al (FIG. 4E). The second conducting layer 408 may for example be between 100 and 500 nanometers thick. Photolithography steps, and then etching steps may for example also be made to complete formation of said second electrode.

According to one variant (not shown), after formation of the interface layer 406, the metallic ion source layer 407, for example based on silver, is formed to be sufficiently thick, for example between 100 and 500 nanometers thick, to act as the second electrode.

With this method, the steps for formation of the chalcogenide layer, formation of a solid electrolyte 405 by doping of said chalcogenide, formation of the interface layer 406 and possibly formation of the ion donor layer 407 may be done in the same deposition machine without it being necessary to implement a photodiffusion step.

Figure 5A:
FIG. 5A illustrates metallic agglomerate phenomena in a stack of thin layers like that used in a PMC cell according to prior art.
Figure 5B:
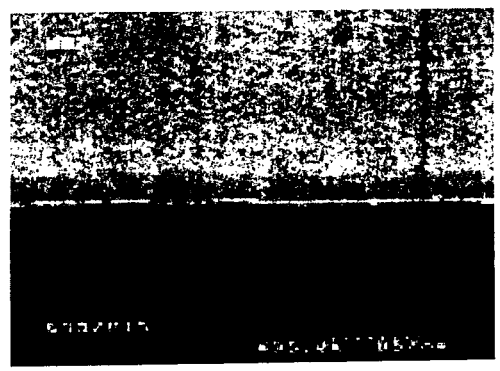
FIG. 5B illustrates a sectional view through a stack of thin layers used in a PMC cell used according to the invention.

FIG. 5A shows a SEM (Scanning Electron Microscope) image of a sectional view of a technological stack of thin layers made during manufacture of a PMC cell according to prior art, and that does not include an intermediate layer between the metallic ion source layer and the chalcogenide layer. In this figure, metallic agglomerates 50 are formed on the chalcogenide layer. FIG. 5B shows a sectional view of a technological stack of thin layers used during manufacturing of a PMC cell according to the invention, and in which there is an intermediate layer between the doped chalcogenide layer acting as the solid electrolyte and the metallic ion donor layer.

The invention claimed is:

1. A microelectronic device comprising at least one cell or element, comprising:
   at least one first electrode;
   at least one second electrode; and
   at least one stack of thin layers between the first electrode and the second electrode;
   wherein the stack comprises:
      at least one doped chalcogenide layer capable of forming a solid electrolyte, the doped chalcogenide layer being provided on and in contact with the first electrode;
      at least one interface layer provided on and in contact with the doped chalcogenide layer, the interface layer being based on a material different from the chalcogenide, the material being carbon or carbon comprising a metallic additive or a semi-conducting additive; and
      at least one metallic ion donor layer provided on and in contact with the interface layer, the metallic ion donor layer being an ion source for the solid electrolyte.

2. The microelectronic device as claimed in claim 1, wherein the interface layer is between 1 and 10 nanometers thick.

3. The microelectronic device as claimed in claim 1, wherein the metallic ion donor layer and the second electrode are formed as a single layer.

4. The microelectronic device as claimed in claim 1, wherein the second electrode is provided on and in contact with the metallic ion donor layer.

5. A memory comprising a microelectronic device comprising at least one cell or element, comprising:
   at least one first electrode;
   at least one second electrode; and
   at least one stack of thin layers between the first electrode and the second electrode;
   wherein the stack comprises:
      at least one doped chalcogenide layer capable of forming a solid electrolyte, the doped chalcogenide layer provided on and in contact with the first electrode;
      at least one interface layer provided on and in contact with the doped chalcogenide layer, the interface layer being based on a material different from chalcogenide, the material being carbon or carbon comprising a metallic additive or a semi-conducting additive;
      at least one metallic ion donor layer provided on and in contact with the interface layer, the metallic ion donor layer being an ion source for the solid electrolyte.

6. The memory as claimed in claim 5, wherein the interface layer is between 1 and 10 nanometers thick.

7. The memory as claimed in claim 6, wherein the metallic ion donor and the second electrode are formed as a single layer.

8. The memory as claimed in claim 7, wherein the second electrode is provided on and in contact with the metallic ion donor layer.

* * * * *